(12) United States Patent
Booske et al.

(10) Patent No.: US 6,951,798 B2
(45) Date of Patent: Oct. 4, 2005

(54) METHOD OF BONDING A STACK OF LAYERS BY ELECTROMAGNETIC INDUCTION HEATING

(75) Inventors: John H. Booske, Madison, WI (US); Keith J. Thompson, Madison, WI (US); Yogesh B. Gianchandani, Madison, WI (US); Reid F. Cooper, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 376 days.

(21) Appl. No.: 10/157,411

(22) Filed: May 29, 2002

(65) Prior Publication Data

US 2003/0000638 A1 Jan. 2, 2003

Related U.S. Application Data

(60) Provisional application No. 60/297,137, filed on Jun. 8, 2001.

(51) Int. Cl.[7] .............................. H01L 21/30; H05B 6/64
(52) U.S. Cl. ........................................ 438/455; 219/678
(58) Field of Search ................................ 438/455–459; 219/678

(56) References Cited

U.S. PATENT DOCUMENTS

| | | | | |
|---|---|---|---|---|
| 4,334,354 A | * | 6/1982 | Luft et al. ..................... | 29/840 |
| 4,871,412 A | * | 10/1989 | Felix et al. .............. | 156/273.9 |
| 4,883,215 A | * | 11/1989 | Goesele et al. ............. | 438/455 |
| 5,273,205 A | * | 12/1993 | Ju et al. ...................... | 438/455 |
| 5,313,034 A | * | 5/1994 | Grimm et al. .............. | 219/765 |
| 5,338,611 A | * | 8/1994 | Lause et al. ................ | 428/412 |
| 5,448,041 A | * | 9/1995 | Benoit et al. ............... | 219/768 |
| 5,479,684 A | * | 1/1996 | Murphy ..................... | 29/25.35 |
| 5,534,097 A | * | 7/1996 | Fasano et al. .............. | 156/214 |
| 5,707,466 A | | 1/1998 | Atwater et al. ............. | 148/525 |
| 5,804,801 A | * | 9/1998 | Lauf et al. .................. | 219/759 |
| 5,851,319 A | * | 12/1998 | Atwater et al. ............. | 148/525 |
| 5,932,048 A | * | 8/1999 | Furukawa et al. .......... | 156/153 |
| 6,008,113 A | * | 12/1999 | Ismail et al. ............... | 438/615 |
| 6,057,212 A | * | 5/2000 | Chan et al. ................. | 438/455 |
| 6,078,035 A | * | 6/2000 | Chittipeddi et al. ........ | 219/759 |
| 6,308,406 B1 | * | 10/2001 | Gill et al. ..................... | 29/849 |
| 6,312,548 B1 | * | 11/2001 | Fathi et al. .............. | 156/275.1 |
| 6,348,679 B1 | * | 2/2002 | Ryan et al. ................. | 219/634 |
| 6,413,874 B1 | * | 7/2002 | Sato ........................... | 438/714 |
| 6,734,409 B1 | * | 5/2004 | Wang et al. ................ | 219/759 |

OTHER PUBLICATIONS

Stanley Wolf, Silicon Processing For the VLSI 1986, Lattice Press, vol. 1, pp. 57–58.*

* cited by examiner

*Primary Examiner*—Michael Lebentritt
*Assistant Examiner*—Scott Geyer
(74) *Attorney, Agent, or Firm*—Boyle Fredrickson Newholm Stein & Gratz S.C.

(57) ABSTRACT

A method of bonding multiple layers is provided. The method includes the steps of stacking the multiple layers on top of each other and volumetrically heating the stack of multiple layers to a predetermined temperature. It is preferred that the stack is heated by electromagnetic induction.

48 Claims, 1 Drawing Sheet

METHOD OF BONDING A STACK OF LAYERS BY ELECTROMAGNETIC INDUCTION HEATING

CROSS-REFERENCE TO RELATED APPLICATIONS

This application claims the benefit of U.S. Provisional Application Ser. No. 60/297,137, filed Jun. 8, 2001.

REFERENCE TO GOVERNMENT GRANT

This invention was made with United States government support awarded by the US Civilian Research & Development Foundation, No. RE1-2065. The United States has certain rights in this invention.

FIELD OF THE INVENTION

This invention relates generally to the bonding of multiple layers, and in particular, to a method of bonding a stack of multiple layers through electromagnetic induction heating.

BACKGROUND OF THE INVENTION

In the past decade, silicon-silicon bonding has received increasing use in the fabrication of micromechanical structures and power electronics. Silicon-silicon bonding is also a candidate technology for manufacturing silicon-on-insulator (SOI) wafers, which are attractive for high speed digital microelectronics. By way of example, in metal-oxide-semiconductor (MOS) transistors fabricated on SOI wafers, the parasitic capacitance associated with source and drain junctions is minimal.

In the bonding process, the polished surfaces of the silicon wafers to be bonded are pressed together at moderate temperatures to form an initial pre-bond. To complete the bond and achieve full strength, the wafers require baking at approximately 1000° Celsius. Conventionally, this is done in large furnaces, which require long ramp times, consume large amounts of power, and have significant manufacturing footprints. The resultant high thermal budget limits process flexibility, making process integration difficult. In addition, furnaces lack the flexibility to adapt to unconventional bonding requirements such as multi-wafer stacks.

It can be appreciated that silicon bonding through electromagnetic induction heating (EMIH) overcomes many conventional limitations. Heretofore, the use of electromagnetic radiation for wafer bonding has been limited. Since it has been assumed that silicon is transparent to electromagnetic radiation because of its small imaginary dielectric response, intermediate glue layers of metal were used to absorb the radiation. In reality, however, the ohmic response of silicon to an oscillating magnetic flux can be used to directly heat the silicon.

SUMMARY OF THE INVENTION

Therefore, it is a primary object and feature of the present invention to provide a method of bonding a stack of silicon wafers which is simpler and less expensive than prior methods.

It is a further object and feature of the present invention to provide a method of bonding a stack of silicon wafers which consumes less power than prior methods.

It is a still further object and feature of the present invention to provide a method of bonding a stack of silicon wafers which bonds the wafers in a shorter time period than prior methods.

In accordance with the present invention, a method of bonding multiple layers is provided. The method includes the steps of stacking the multiple layers on top of each other and generating an electromagnetic field which intersects the stack of the multiple layers. The electromagnetic field heats the multiple layers to a predetermined temperature.

The method may include the additional step of providing a resonant cavity extending along a longitudinal axis. The cavity has length which is adjustable along the axis. The stack of multiple layers is positioned in the cavity at a predetermined location where the intensity of the electromagnetic field is maximized. The length of the cavity may be adjusted to a user selected length to vary the electromagnetic field.

The step of generating the electromagnetic field may include injecting microwave radiation into the cavity and tuning the microwave radiation to minimize reflections from the cavity. Alternatively, the step of generating the electromagnetic field may include the step of generating a magnetic field which intersects the stack of multiple layers. The magnetic field may be generated by providing a conducting material and passing a current through the conducting material at a predetermined frequency.

It is contemplated to preheat the stack of multiple layers to a coupling temperature so as to initiate the bonding of the multiple layers. It is preferred that the coupling temperature be between 20° and 200° Celsius and the predetermined temperature be between 800° and 1100° Celsius.

The multiple layers may be cleaned prior to stacking the multiple layers to facilitate the bonding of the layers in a stack. The layers are cleaned first in a $NaOH:H_2O_2:H_2O$ (5:1:1) solution at 80° Celsius, followed by a $H_2SO_4:H_2O$ (5:1) solution at 80° Celsius. In addition, the step of cleaning the multiple layers may also include the additional steps of dipping the layers in dilute (100:1) HF to remove any residual oxide layer; rinsing the layers in deionized water; and spinning the layers completely dry to minimize the amount of residual moisture thereon.

In accordance with a further aspect of the present invention, a method of bonding multiple layers is provided. The method includes the steps of stacking the multiple layers on top of each other and volumetrically heating the stack of multiple layers to a predetermined temperature.

A resonant cavity extending along a longitudinal axis is provided and an electromagnetic field is generated therein. The cavity has length which is adjustable along the axis to vary the electromagnetic field. The stack of multiple layers is positioned in the cavity at a predetermined location where the intensity of the electromagnetic field is maximized.

The electromagnetic field may be generated by injecting microwave radiation into the cavity and by tuning the microwave radiation to minimize reflections from the cavity. Alternatively, the electromagnetic field may be generated by generating a magnetic field which intersects the stack of multiple layers. The magnetic field may be generated by providing a conducting material and passing a current through the conducting material at a predetermined frequency.

It is contemplated to preheat the stack of multiple layers to a coupling temperature so as to initiate the bonding of the multiple layers. It is preferred that the coupling temperature be between 20° and 200° Celsius and the predetermined temperature be between 800° and 1100° Celsius.

The multiple layers may be cleaned prior to stacking the multiple layers to facilitate the bonding of the layers in a stack. The layers are cleaned first in a $NaOH:H_2O_2:H_2O$ (5:1:1) solution at 80° Celsius, followed by a $H_2SO_4:H_2O$ (5:1) solution at 80° Celsius. In addition, the step of cleaning the multiple layers may also include the additional steps dipping in dilute (100:1) HF (hydrogen floride) to remove any residual oxide layer; rinsing the layers in deionized water; and spinning the layers completely dry to minimize the amount of residual moisture thereon.

In accordance with a still further aspect of the present invention, a method of bonding multiple layers is provided. The layers are cleaned in a $NaOH:H_2O_2:H_2O$ (5:1:1) solution at 80° Celsius, followed by a $H_2SO_4:H_2O$ (5:1) solution at 80° Celsius. The cleaned multiple layers are brought into contact together to form a stack that is volumetrically heated to a predetermined temperature.

The step of cleaning the multiple layers may also include the additional steps dipping in dilute (100:1) HF to remove any residual oxide layer; rinsing the layers in deionized water; and spinning the layers completely dry to minimize the amount of residual moisture thereon.

A generally cylindrical resonant cavity extending along a longitudinal axis is provided and an electromagnetic field is generated therein. The cavity has length which is adjustable along the axis to vary the electromagnetic field. The stack of multiple layers is positioned in the cavity at a predetermined location where the intensity of the electromagnetic field is maximized.

The electromagnetic field may be generated by injecting microwave radiation into the cavity and by tuning the microwave radiation to minimize reflections from the cavity. Alternatively, the electromagnetic field may be generated by generating a magnetic field which intersects the stack of multiple layers. The magnetic field may be generated by providing a coil winding and passing a current through the coil winding at a predetermined frequency.

It is contemplated to preheat the stack of multiple layers to a coupling temperature so as to initiate the bonding of the multiple layers. It is preferred that the coupling temperature be between 20° and 200° Celsius and the predetermined temperature be between 800° and 1100° Celsius.

BRIEF DESCRIPTION OF THE DRAWINGS

The drawings furnished herewith illustrate a preferred construction of the present invention in which the above advantages and features are clearly disclosed as well as others which will be readily understood from the following description of the illustrated embodiment.

In the drawings.

DETAILED DESCRIPTION OF THE DRAWINGS

Figure 1:
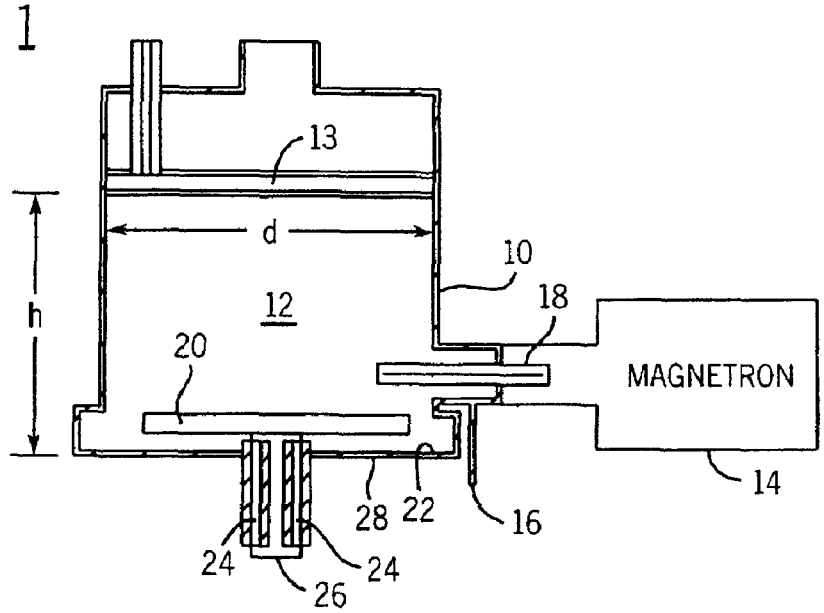
FIG. 1 is a schematic view of a structure for the electromagnetic induction heating of a plurality of silicon wafers in accordance with the method of the present invention.

It can be appreciated that electromagnetic induction heating (EMIH) is a unique application of Faraday's and Ampere's laws. When a silicon wafer is exposed to oscillating magnetic fields, currents—more specifically electrons and holes—are induced to flow within the wafer (Faraday's law). These electrons, through collisions with the lattice, give up their energy by heating the wafer.

Predicting the magnitude of these induced currents, however, requires a more detailed analysis of Faraday's and Ampere's laws. The currents induced in highly conducting materials, e.g. copper, re-induce a magnetic field that partially or completely interferes destructively with the incident field. This is commonly known as shielding or skin-depth. Conversely, the lack of free carriers in insulating materials, e.g. quartz, precludes any flow of current and allows the incident field to penetrate through the material. Semiconductors fall in between these two extremes and therefore have the potential for significant field penetration that induces substantial currents throughout the volume of the wafer. This enables the possibility for substantial and volumetric heating, rather than just surface heating. This can be illustrated best by a self-consistent solution of Ampere's and Faraday's laws that obtains a first order description of induced current density and the subsequent power absorbed:

$$P_{ABS} = \frac{\pi a^2 t_w^3/(\delta^4 \sigma)}{1+(t_w/\delta)^4} H_0^2, \delta = \sqrt{2/\omega\mu\sigma} \qquad (1)$$

wherein: $\sigma$ is conductivity; $t_w$ is thickness; $\delta$ is skin depth; $\omega$ is frequency; $\mu$ is permeability; "a" is radius; and $H_0$ is the incident magnetic field. It is inferable from Equation (1) that the absorbed power increases with conductivity, $\sigma$, until a peak absorption point is reached at which point the power decreases and asymptotes to zero.

The strong dependence of power absorption on conductivity adds an elusive element to the heating of silicon because of the non-linear relationship between temperature and conductivity in a silicon wafer. As is known, conductivity is the product of mobility and carrier density. However, both these terms, mobility and carrier density, have opposing relationships with respect to temperature. Mobility decreases with temperature due to an increased collision frequency that impedes the flow of carriers. Carrier density increases with temperature as the increased thermal energy moves more carriers from the valence band into the conduction band; thereby increasing the intrinsic carrier concentration.

It can be appreciated that conductivity initially decreases with temperature—as collisions impede carrier mobility—until the temperature exceeds ~100° Celsius. At such point, the increase in intrinsic carriers overcomes the loss in mobility and conductivity increases monotonically with temperature. As a result, a conductivity valley exists just above room temperature (50–125° Celsius). This creates, due to the strong dependence of power absorption on conductivity, the possibility of an absorption valley which prevents the wafer from heating beyond ~100° Celsius. Once beyond this point, conductivity increases with temperature and power absorption increases with conductivity. This creates a runaway heating effect that results in extremely rapid temperature ramp rates. Further, above ~500° Celsius, the intrinsic carrier concentration becomes much greater than the background doping; consequently, the intrinsic carriers, not the specific wafer doping, dominate conductivity. Consequently, above 500° Celsius wafer heating becomes independent of the initial substrate doping, and silicon wafers of various room temperature conductivities heat in an identical fashion.

Referring to FIG. 1, a cylindrical resonant chamber for electromagnetic induction heating a plurality of layers such as silicon wafers is generally designated by the reference numeral 10. Resonant chamber 10 defines a cavity 12 having a predetermined diameter d and an adjustable height h.

Height h of cavity 12 is adjusted by moving adjustable top 13 which, in turn, allows a user to tune in specific modes, for reasons hereinafter described.

Resonant chamber 10 is operatively connected to magnetron 14 by a waveguide 16. Magnetron 14 converts electrical energy to microwave radiation such that magnetron 14 may provide microwaves to cavity 12 within resonant chamber 10 through waveguide 16. As is known, magnetron 14 is capable of generating microwaves having frequencies between 100 MHz and 10 GHz. However, it is contemplated as being within the scope of the present invention to replace magnetron 14 with an alternate microwave generator in order to provide microwaves having frequencies of up to 30 GHz. Radial tuner 18 is positioned in the interior of waveguide 16 to minimize reflected power.

A plurality of layers such as silicon wafers 20 is positioned on hollow quartz cylinders 24 within cavity 12 of resonant chamber 10 adjacent cavity bottom 22 thereof. Silicon wafers 20 are positioned just above cavity bottom 22 to ensure that the silicon wafers 20 are in a magnetic field maximum. Since the electromagnetic energy absorbed by silicon wafers 20 is directly proportional to the magnetic field intensity, the uniformity of the magnetic field pattern in cavity 12 for the various modes in the plane of silicon wafers 20 can have a strong influence on the uniformity of the heating of silicon wafers 20. As such, adjustable top 13 of resonant chamber 10 is positioned by a user to tune in specific modes.

In order to heat silicon wafers 20 utilizing EMIH, intense electromagnetic fields must be used to induce currents to flow through silicon wafer 20. Magnetron 14 provides cavity 12 with microwaves, as heretofore described, such that highly energetic electrons collide with the lattice of the silicon, transferring energy to the lattice in the form of heat. As the temperature of the silicon wafers 20 rises, additional electrons move into the conduction band and are available to flow as current, thereby increasing the power absorbed by silicon wafers. This process continues until radiation losses equal the power absorbed, forcing a steady state operating point. As described, silicon wafers 20 can be rapidly ramped to temperatures in the range of 800° to 1100° Celsius, and preferably above 1000° Celsius, so as to bond the plurality of silicon wafers 20 together. It is contemplated to create the bond between the silicon wafers 20, silicon wafers 20 are ramped to 1000° C. at a rate of 125° C./sec, soaked at 1000° Celsius for 5 minutes, and cooled to room temperature in ≈5 seconds.

It can be appreciated that temperature measurement in the presence of intense electromagnetic fields is difficult under the best circumstances. In order to obtain such temperature measurement, an optical pyrometer or light-pipe 26, calibrated to the specific emissivity of silicon in the temperature range of interest (800–1100° Celsius), is fed through the bottom 28 of resonant chamber 10. Light pipe 26 allows the temperature to be accurately measured without perturbing the field patterns. In addition, light-pipe 26 may be used to obtain localized spatial measurements.

Figure 2:
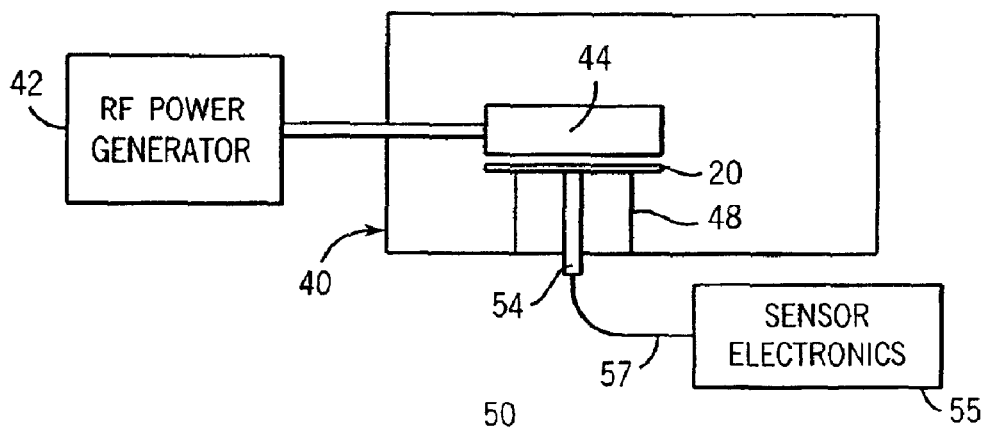
FIG. 2 is a schematic view of an alternate structure for the electromagnetic induction heating of a plurality of silicon wafers in accordance with the method of the present invention.
Figure 3:
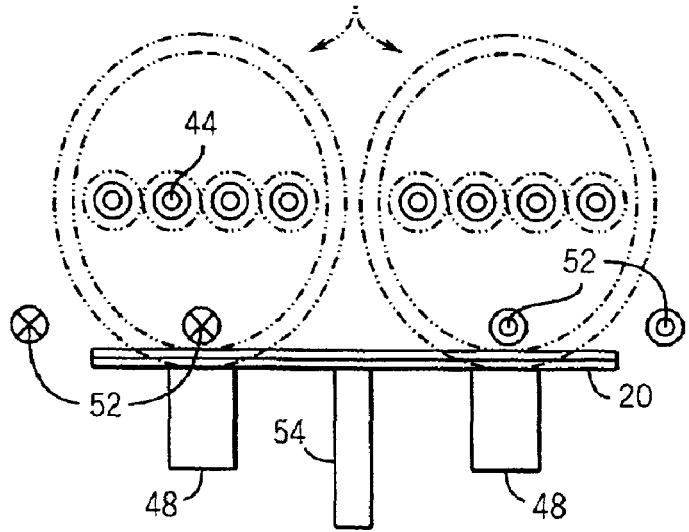
FIG. 3 is a second, schematic view of the alternate structure of FIG. 2.

Referring to FIGS. 2–3, an alternate structure for electromagnetic induction heating a plurality of silicon wafers is generally designated by the reference numeral 40. Structure 40 includes a radio frequency power generator 42 operatively connected to a radio frequency antenna 44. In the preferred embodiment, radio frequency antenna 44 takes the form a copper coil winding.

A plurality of layers such as silicon wafers 20 are stacked upon each other and are positioned on a plurality of ceramic support rods 48 just below (e.g. 2.5 centimeters) radio frequency antenna 44. Ceramic support rods 48 may be heated in any conventional manner to a user desired temperature between 20° and 200° Celsius, and preferably 150° Celsius, in order to preheat silicon wafers 20 to such point as to initiate coupling of silicon wafers 20 to each other.

In operation, frequency power generator 42 provides current at a frequency less than 300 MHz through radio frequency antenna 44 to induce magnetic field 50 and electric field 52. Fields 50 and 52 induce highly energetic electrons collide with the lattice of the silicon, transferring energy to the lattice in the form of heat. As the temperature of the silicon wafers 20 rises, additional electrons move into the conduction band and are available to flow as current, thereby increasing the power absorbed by silicon wafers 20. This process continues until radiation losses equal the power absorbed, forcing a steady state operating point. As described, silicon wafers 20 can be rapidly ramped to temperatures in the range of 800° to 1100° Celsius, and preferably above 1000° Celsius, so as to bond the plurality of silicon wafers 20 together. As heretofore described, to create the bond between the plurality of silicon wafers 20, silicon wafers 20 are ramped to 1000° Celsius at a rate of 125° C./sec, soaked at 1000° Celsius for 5 minutes, and cooled to room temperature in ≈5 seconds.

In order to obtain such temperature measurement, an optical pyrometer or light pipe 54, calibrated to the specific emissivity of silicon in the temperature range of interest (800–1100° Celsius), is positioned adjacent silicon wafers 20. Light pipe is operatively connected to various sensor electronics 55 by optical fiber 57. Sensor electronics 55 process the signals received from light pipe 54 such that light pipe 54 may be used to the temperature to be accurately measure the temperature of the silicon wafers 20 without perturbing the field patterns. In addition, light pipe 54 may be used to obtain localized spatial measurements.

Surface preparation is an important step in conventional wafer bonding, as well as, in EMIH bonding. Poor surface preparation can result in voids, particularly when rapid temperature ramps are used. During the heating process, adsorbed water trapped between the wafer surfaces quickly vaporizes and expands, increasing local pressures along the bond interface. This pressure can force the surfaces of silicon wafers 20 apart, creating voids in an otherwise uniform bond. Furthermore, the oxygen present in the water may react locally with the silicon surface to form silicon dioxide, making uneven the surface over which the bond is formed. In extreme cases, silicon wafers 20 may delaminate during the temperature ramp.

In order to minimize the possibility of void formation along the bond interfaces of the plurality of silicon wafers 20, silicon wafers 20 may be cleaned prior to EMIH. The silicon wafers 20 are first cleaned in a $NaOH:H_2O_2:H_2O$ (5:1:1) solution at 80° Celsius, followed by a $H_2SO_4:H_2O$ (5:1) solution at 80° Celsius, and finally dipped in dilute (100:1) HF to remove any residual oxide layer. Silicon wafers may then be rinsed in deionized water and spun completely dry to minimize the amount of residual moisture on the surfaces of the silicon wafers 20. Once dry, silicon wafers 20 are immediately pressed together, and thereafter, bonded together as heretofore described.

It is contemplated to clean the silicon wafers 20 in other manners including, but are not limited to, oxygen plasma or hydrogen plasma treatments followed by a vigorous rinse in deionized water. It is intended for the cleaning of silicon wafers 20 to remove particulates and contaminants from the surface of silicon wafers 20 and to condition such surfaces for optimal bonding prior to the stacking the silicon wafers 20.

While the method of the present invention has been described in connection with silicon-silicon bonding, it can be appreciated that other types of bonding, such as silicon-on-insulator bonding, are contemplated without deviating from the scope of the present invention. Further, the bonding of materials such as Germanium and Si—Ge hybrid materials are contemplated as being within the scope of the present invention. As such, it can be appreciated that various modes of carrying out the invention are contemplated as being within the scope of the following claims particularly pointing out and distinctly claiming the subject matter which is regarded as the invention.

We claim:

1. A method of bonding multiple layers, the method comprising the steps of:
   stacking the multiple layers on top of each other; and
   generating an electromagnetic field which intersects and volumetrically heats the multiple layers to a predetermined temperature.

2. The method of claim 1 comprising the additional steps of:
   providing a resonant cavity extending along a longitudinal axis, the cavity having length which is adjustable along the axis; and
   positioning the stack of multiple layers in the cavity.

3. The method of claim 2 wherein the stack of multiple layers are positioned within the cavity at a predetermined location wherein the intensity of the electromagnetic field is maximized.

4. The method of claim 2 comprising the additional step of adjusting the length of cavity to a user selected length to vary the electromagnetic field.

5. The method of claim 2 wherein the step of generating electromagnetic fields includes injecting microwave radiation into the cavity.

6. The method of claim 5 comprising the additional step of tuning the microwave radiation to minimize reflections from the cavity.

7. The method of claim 1 wherein the step of generating the electromagnetic field includes the step of generating a magnetic field which intersects the stack of multiple layers.

8. The method of claim 7 wherein the step of generating a magnetic field includes the steps of providing a conducting material and passing a current at a predetermined frequency through the conducting material.

9. The method of claim 7 wherein the predetermined frequency is less than 300 MHz.

10. The method of claim 1 comprising the additional step of preheating the stack of multiple layers to a coupling temperature so as to initiate bonding of the multiple layers.

11. The method of claim 10 wherein the coupling temperature is between 20° and 200° Celsius.

12. The method of claim 1 wherein the predetermined temperature is between 800° and 1100° Celsius.

13. The method of claim 1 further comprising the additional step of cleaning the multiple layers prior to stacking the multiple layers.

14. The method of claim 13 comprising the additional step of bringing the multiple layers into contact after the step of stacking the multiple layers.

15. The method of claim 13 wherein the step of cleaning the multiple layers includes the steps:
    depositing each of the multiple layers in a $NaOH:H_2O_2:H_2O$ (5:1:1) solution at 80° Celsius; and
    depositing each of the multiple layers in a $H_2SO_4:H_2O$ (5:1) solution at 80° Celsius.

16. The method of claim 13 wherein the step of cleaning the multiple layers includes the additional steps:
    dipping each of the multiple layers in dilute (100:1) HF;
    rinsing each of the multiple layers in deionized water; and
    spinning the multiple layers completely dry.

17. A method of bonding multiple layers, the method comprising the steps of:
    stacking the multiple layers on top of each other; and
    generating an electromagnetic field which intersects the stack of the multiple layers to volumetrically heat the stack of multiple layers to a predetermined temperature.

18. The method of claim 17 comprising the additional steps of:
    providing a resonant cavity extending along a longitudinal axis, the cavity having length which is adjustable along the axis; and
    positioning the stack of multiple layers in the cavity.

19. The method of claim 18 wherein the stack of multiple layers are positioned within the cavity at a predetermined location wherein the intensity of the electromagnetic field is maximized.

20. The method of claim 18 comprising the additional step of adjusting the length of cavity to a user selected length to vary the electromagnetic field.

21. The method of claim 18 wherein the step of generating electromagnetic fields includes injecting microwave radiation into the cavity.

22. The method of claim 21 comprising the additional step of tuning the microwave radiation to minimize reflections from the cavity.

23. The method of claim 17 comprising the additional step of preheating the stack of multiple layers to a coupling temperature so as to initiate bonding of the multiple layers.

24. The method of claim 23 wherein the coupling temperature is between 20° and 200° Celsius.

25. The method of claim 17 wherein the predetermined temperature is between 800° and 1100° Celsius.

26. The method of claim 17 further comprising the additional step of cleaning the multiple layers prior to stacking the multiple layers.

27. The method of claim 26 wherein the step of cleaning the multiple layers includes the steps:
    depositing each of the multiple layers in a $NaOH:H_2O_2:H_2O$ (5:1:1) solution at 80° Celsius; and
    depositing each of the multiple layers in a $H_2SO_4:H_2O$ (5:1) solution at 80° Celsius.

28. The method of claim 27 wherein the step of cleaning the multiple layers includes the additional steps:
    dipping each of the multiple layers in dilute (100:1) HF;
    rinsing each of the multiple layers in deionized water; and
    spinning the multiple layers completely dry.

29. The method of claim 17 comprising the additional step of bringing the multiple layers into contact after the step of stacking the multiple layers.

30. The method of claim 17 wherein the stack of multiple layers is heated by electromagnetic induction.

31. A method of bonding multiple layers, the method comprising the steps of:
    depositing each of the multiple layers in a $NaOH:H_2O_2:H_2O$ (5:1:1) solution at 80° Celsius;
    depositing each of the multiple layers in a $H_2SO_4:H_2O$ (5:1) solution at 80° Celsius;

pressing the multiple layers together to form a stack; and volumetrically heating the stack to a predetermined temperature.

32. The method of claim 31 wherein the step of heating the stack includes the step of generating an electromagnetic field which intersects the stack.

33. The method of claim 32 comprising the additional steps of:

providing a resonant cavity extending along a longitudinal axis, the cavity having length which is adjustable along the axis; and positioning the stack in the cavity.

34. The method of claim 33 wherein the stack is positioned within the cavity at a predetermined location wherein the intensity of the electromagnetic field is maximized.

35. The method of claim 33 comprising the additional step of adjusting the length of cavity to a user selected length to vary the electromagnetic field.

36. The method of claim 33 wherein the step of generating the electromagnetic field includes injecting microwave radiation into the cavity.

37. The method of claim 36 comprising the additional step of tuning the microwave radiation to minimize reflections from the cavity.

38. The method of claim 31 wherein the step of heating the stack includes the step of generating a magnetic field which intersects the stack of multiple layers.

39. The method of claim 38 wherein the step of generating the magnetic field includes the steps of providing a conducting material and passing a current at a predetermined frequency through the conducting material.

40. The method of claim 38 wherein the predetermined frequency is less than 300 MHz.

41. The method of claim 31 comprising the additional step of preheating the stack to a coupling temperature so as to initiate bonding of the multiple layers.

42. The method of claim 41 wherein the coupling temperature is between 20° and 200° Celsius.

43. The method of claim 31 wherein the predetermined temperature is between 800° and 1100° Celsius.

44. The method of claim 31 wherein the stack is heated by electromagnetic induction.

45. The method of claim 31 further comprising the additional step of cleaning the multiple layers by:

dipping each of the multiple layers in dilute (100:1) HF;

rinsing each of the multiple layers in deionized water; and spinning the multiple layers completely dry.

46. A method of bonding multiple layers, the method comprising the steps of:

stacking the multiple layers on top of each other; and generating a magnetic field which intersects the stack of multiple layers to volumetrically heat the stack of multiple layers to a predetermined temperature.

47. The method of claim 46 wherein the step of generating the magnetic field includes the steps of providing a conducting material and passing a current at a predetermined frequency through the conducting material.

48. The method of claim 47 wherein the wherein the predetermined frequency is less than 300 MHz.

* * * * *